(12) United States Patent
Huang

(10) Patent No.: US 11,637,215 B2
(45) Date of Patent: Apr. 25, 2023

(54) PIN/PIN STACKED PHOTODETECTION FILM AND PHOTODETECTION DISPLAY APPARATUS

(71) Applicant: SHANGHAI HARVEST INTELLIGENCE TECHNOLOGY CO., LTD., Shanghai (CN)

(72) Inventor: Jiandong Huang, Shanghai (CN)

(73) Assignee: SHANGHAI HARVEST INTELLIGENCE TECHNOLOGY CO, LTD., Shanghai (CN)

( * ) Notice: Subject to any disclaimer, the term of this patent is extended or adjusted under 35 U.S.C. 154(b) by 361 days.

(21) Appl. No.: 16/611,460

(22) PCT Filed: May 15, 2018

(86) PCT No.: PCT/CN2018/086902
§ 371 (c)(1),
(2) Date: Nov. 6, 2019

(87) PCT Pub. No.: WO2018/210240
PCT Pub. Date: Nov. 22, 2018

(65) Prior Publication Data
US 2020/0395498 A1    Dec. 17, 2020

(30) Foreign Application Priority Data
May 17, 2017 (CN) .......................... 201710348713.0

(51) Int. Cl.
*H01L 31/105* (2006.01)
*H01L 25/16* (2006.01)
(Continued)

(52) U.S. Cl.
CPC ...... *H01L 31/1055* (2013.01); *G02F 1/13318* (2013.01); *H01L 25/167* (2013.01);
(Continued)

(58) Field of Classification Search
CPC ....... H01L 27/14643–14663; H01L 27/14647; H01L 27/14652; H01L 31/105–1055
See application file for complete search history.

(56) References Cited

U.S. PATENT DOCUMENTS 9,473,714 B2 * 10/2016 Aoki ..................... H04N 5/3741
2006/0267054 A1 * 11/2006 Martin ................. H01L 31/105
257/292
(Continued)

OTHER PUBLICATIONS

"Hydrogenated Amorphous Silicon—Material Properties and Device Applications", Walther Fuhs, in Charge Transport in Disordered Solids with Applications in Electronics, S. Varanovski editor, John Wiley and Sons (Year: 2006).*
(Continued)

*Primary Examiner* — Kevin Parendo
(74) *Attorney, Agent, or Firm* — Womble Bond Dickinson (US) LLP

(57) ABSTRACT

A photodetection film includes at least one lower photodiode and upper photodiode layered members. The at least one lower photodiode layered member includes lower first-type, intrinsic and second-type semiconductor layers. The at least one upper photodiode layered member is disposed on the at least one lower photodiode layered member and includes upper first-type, intrinsic and second-type semiconductor layers. The upper intrinsic semiconductor layer has an amorphous silicon structure. The lower intrinsic semiconductor layer has a structure selected from one of a microcrystalline silicon structure, a microcrystalline silicon-germanium structure, and a non-crystalline silicon-germanium structure.

29 Claims, 8 Drawing Sheets

(51) Int. Cl.
    *H01L 27/12*      (2006.01)
    *H01L 27/146*     (2006.01)
    *H01L 27/32*      (2006.01)
    *H01L 31/0216*    (2014.01)
    *H01L 31/18*      (2006.01)
    *G02F 1/133*      (2006.01)

(52) U.S. Cl.
    CPC .... *H01L 27/1214* (2013.01); *H01L 27/14625* (2013.01); *H01L 27/3234* (2013.01); *H01L 31/02161* (2013.01); *H01L 31/1804* (2013.01)

(56) References Cited

U.S. PATENT DOCUMENTS

| | | | |
|---|---|---|---|
| 2008/0099793 A1* | 5/2008 | Fattal | H01L 31/1085 257/233 |
| 2010/0059110 A1* | 3/2010 | Sheng | C23C 16/5096 136/258 |
| 2012/0002090 A1* | 1/2012 | Aoki | H04N 5/3741 348/297 |

OTHER PUBLICATIONS

S. Guha et al, "Amorphous Silicon Alloy Photovoltaic Research—Present and Future", 2000, Progress in Photovoltaics: Research and Applications, Prog. Photovolt. Res. Appl. 8, 141-150 (Year: 2000).*

* cited by examiner

PIN/PIN STACKED PHOTODETECTION FILM AND PHOTODETECTION DISPLAY APPARATUS

FIELD

The disclosure relates to a photodetection film, and more particularly to a photodetection film including lower and upper photodiode layered members, photodetection device and photodetection display apparatus including the photodetection film, and a method of making the photodetection film and the photodetection device.

BACKGROUND

A conventional display apparatus, such as a liquid crystal display (LCD) apparatus or an active matrix organic light emitting display (AMOLED) apparatus, includes a plurality of thin-film transistors (TFTs) and a plurality of pixels that are arranged in an array. Each of the pixels is driven by a respective one of the thin-film transistors for displaying an image. Each of the TFTs is a field-effect transistor that includes a semiconductor layer made from a semiconducting material such as amorphous silicon, crystalline silicon, indium gallium zinc oxide (IGZO), a nanocarbon material-mixed organic material, and combinations thereof. Since photodiodes may be manufactured using the above semiconducting material and since production equipment of the photodiodes is incorporable to production equipment of the TFTs array, a photodetection device including a plurality of photodiodes and a plurality of TFTs arranged in an array is manufactured using the production equipment of the TFTs array and utilized in different fields, such as an X-ray flat panel detector disclosed in Chinese Invention Patent Publication No. CN 103829959 B and an X-ray image sensing element and sensing module disclosed in Chinese Invention Patent Publication No. CN 102903721 B.

Compared with photodetection devices made from conventional crystalline materials, the semiconducting material for making the photodiodes of the conventional photodetection device has a band gap for absorbing substantial visible light, and the conventional photodetection device has a relatively low signal-to-noise ratio (SNR) due to less interference from environmental visible light. Hence, the application of the photodetection device focuses primarily on the technical aspects of X-ray detection or sensing, such as the abovementioned X-ray flat panel detector and X-ray image sensing element and sensing module. For alleviating the interference from the environmental visible light, the abovementioned X-ray flat panel detector and the X-ray image sensing element and sensing module include at least one fluorescent layer or flickering layer for converting an incident X-ray light, which has a relatively short wavelength and a relatively high collimation, compared to the visible light. The visible light subsequently emits on the photodiodes.

The integration of the photodetection device with the conventional display apparatus has been contemplated so as to realize the display apparatus with a photodetection function. However, due to limitations of a thickness of the display apparatus and a pixel aperture ratio of the conventional photodetection display apparatus, an image generated from the light detected by the photodiodes is distorted because of optical diffraction. Besides, an incident light has to pass through multiple layers of the conventional photodetection display apparatus before being detected by the photodiodes. Thus, it is difficult to abstract useful optical signals from the environment inside the photodetection display apparatus, where the signal-to-noise ratio is relatively low and where electrical signals generated by the photodiodes that is received from optical signals, coexist with sensing signals generated by a touch panel that is received from touching signals The difficulty in abstracting the useful optical signals is approximately equal to that of single-photon imaging. An original image generated by the electrical signals has to be resolved by reconstruction through an algorithm on the basis of an optic theory. In order to deal with the difficulty of optical-signal abstraction, it is proposed to further dispose an optical reinforcing member in the conventional photodetection display apparatus or to dispose the photodiodes on a side of a display unit, such as a display module disclosed in Chinese Invention Patent Publication No. 101359369 B, so as to reconstruct the image through light that is not vertically incident on the side of the display unit. However, inclusion of the optical reinforcing member disadvantageously increases the thickness of the photodetection display apparatus and side-arrangement of the photodiodes on the display unit tends to impede full-screen viewing.

Referring to FIG. 1, a conventional photodetection film 1 includes a single photodiode layered structure 11 that includes an n-type semiconductor layer 111, a p-type semiconductor layer 113, and an intrinsic semiconductor layer 112 interposed between the n-type semiconductor layer 111 and the p-type semiconductor layer 113. However, the conventional photodetection film 1 has relatively low photoelectric conversion efficiency when applied to a photodetection display apparatus and cannot meet a high photosensitivity requirement of a photodetection device. Hence, it is difficult to broaden an application range of the photodetection display apparatus that is integrated with the conventional photodetection film 1. Therefore, there is still a room for improving the photodetection film of a photodetection display apparatus with photodetection function for expanding detectable wavelength range and enhancing the efficiency of photoelectric conversion accordingly.

SUMMARY

Therefore, an object of the disclosure is to provide a photodetection film that can alleviate at least one of the drawbacks of the prior art.

According one aspect of to the disclosure, the photodetection film includes at least one lower photodiode layered member, and at least one upper photodiode layered member.

The at least one lower photodiode layered member includes a lower first-type semiconductor layer, a lower intrinsic semiconductor layer that is disposed on the lower first-type semiconductor layer, and a lower second-type semiconductor layer that is disposed on the lower intrinsic semiconductor layer.

The at least one upper photodiode layered member is disposed on the at least one lower photodiode layered member, and includes an upper first-type semiconductor layer that is disposed on the lower second-type semiconductor layer, an upper intrinsic semiconductor layer that is disposed on the upper first-type semiconductor layer, and an upper second-type semiconductor layer that is disposed on the upper intrinsic layer.

Each of the lower and upper second-type semiconductor layers is one of a p-type semiconductor layer and an n-type semiconductor layer, and each of the lower and upper first-type semiconductor layers is the other one of the p-type semiconductor layer and the n-type semiconductor layer.

The upper intrinsic semiconductor layer has an amorphous silicon structure. The lower intrinsic semiconductor layer has a structure selected from one of a microcrystalline silicon structure, a microcrystalline silicon-germanium structure, and a non-crystalline silicon-germanium structure.

According to another aspect of the disclosure, a photodetection device includes a photodiode unit that includes the above photodetection film, and a thin film transistor unit that includes a thin film transistor electrically connected to the photodetection film of the photodiode unit for transmitting electrical signal from the photodiode film.

According to still another aspect of the disclosure, a photodetection display apparatus includes a display unit defining at least one photodetection region, and at least one photodetection assembly. The at least one photodetection assembly is disposed below the at least one photodetection region and includes the above photodetection device.

According to the other aspect of the disclosure, a method of making a photodetection film includes: forming a lower photodiode layered member on a substrate, which includes forming a lower first-type semiconductor layer on the substrate, forming a lower intrinsic semiconductor layer on the lower first-type semiconductor layer, and forming a lower second-type semiconductor layer on the lower intrinsic semiconductor layer; and forming an upper first-type semiconductor layer on the lower photodiode layered member, which includes forming an upper first-type semiconductor layer on the lower second-type semiconductor layer of the lower photodiode layered member, forming an upper intrinsic semiconductor layer on the upper first-type semiconductor layer, and forming an upper second-type semiconductor layer on the upper intrinsic semiconductor layer.

Each of the lower and upper second-type semiconductor layers is formed into one of a p-type semiconductor layer and an n-type semiconductor layer, and each of the lower and upper first-type semiconductor layers are formed into the other one of the p-type semiconductor layer and the n-type semiconductor layer.

The upper intrinsic semiconductor layer has an amorphous silicon structure. The lower intrinsic semiconductor layer has a structure selected from a microcrystalline silicon structure, a microcrystalline silicon-germanium structure, and a non-crystalline silicon-germanium structure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
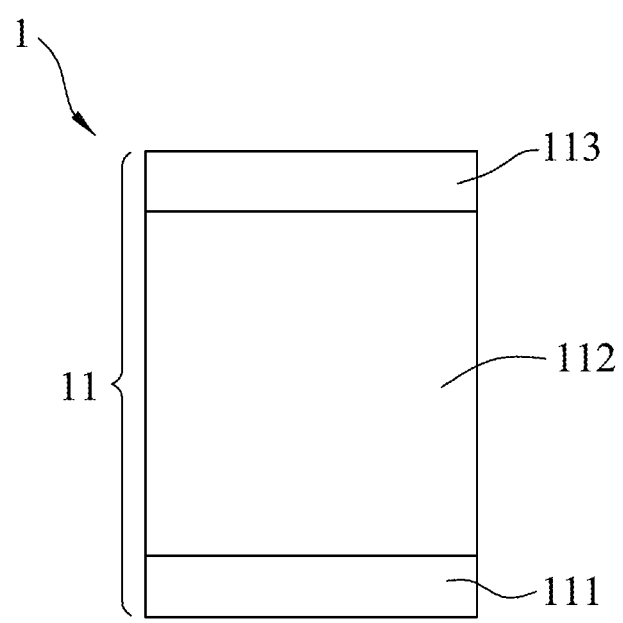
FIG. 1 is a schematic view illustrating a conventional photodiode.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
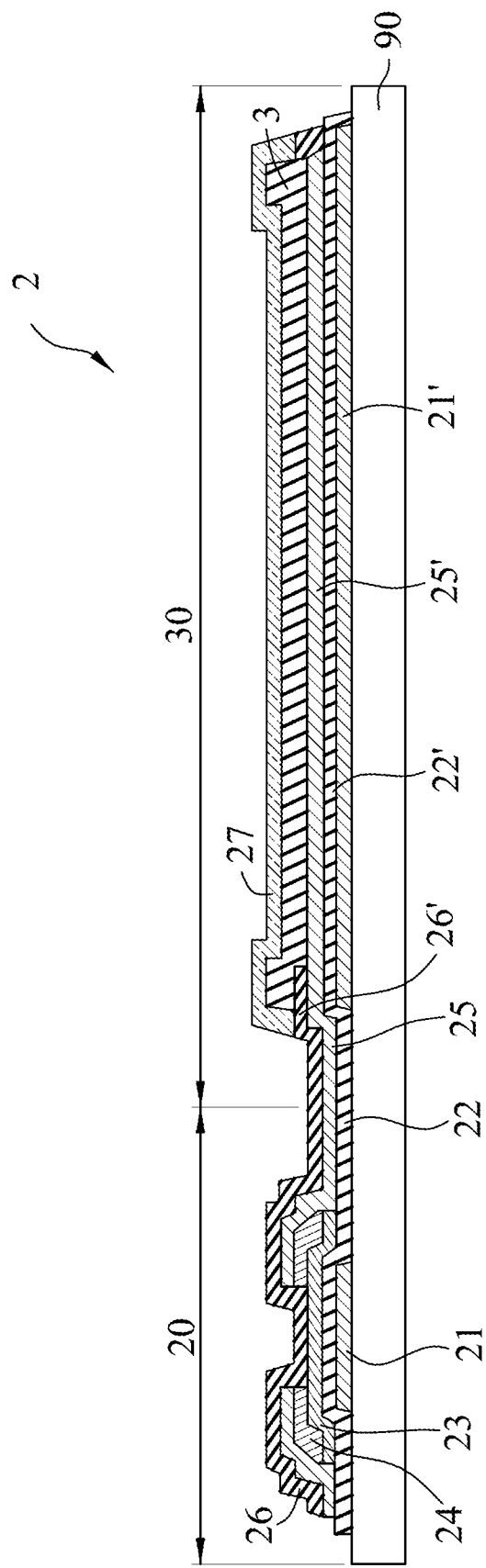
FIG. 2 is a schematic view illustrating an embodiment of a photodetection device according to the disclosure.
Figure 10:
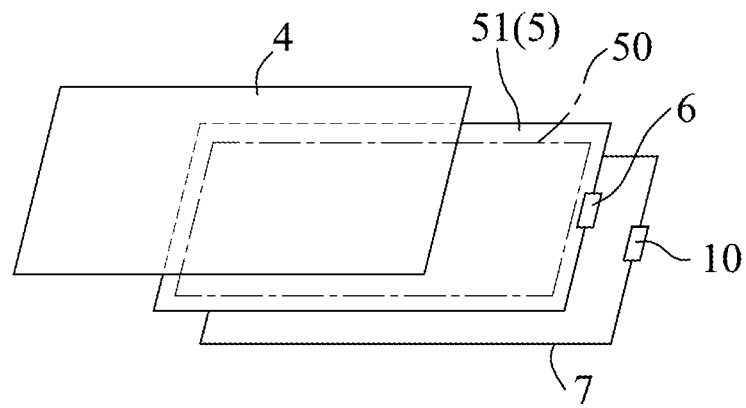
FIG. 10 is a schematic view illustrating a first embodiment of a photodetection display apparatus according to the disclosure.

Referring to FIG. 2, an embodiment of a photodetection device 2 according to the disclosure includes a thin film transistor unit 20, and at least one photodetection unit 30 that is electrically connected to the thin film transistor unit 20. The photodetection device 2 may include a plurality of the thin film transistor units 20 and a plurality of the photodiode units 30. Each of the photodiode units 30 is electrically connected to a respective one of the thin film transistor units 20. When the photodetection device 2 is included in a photodetection display apparatus (as shown in FIG. 10) including a display unit 5, the photodetection device 2 may be disposed below the display unit 5 including a display member 51 and a driving circuit member 6, and may be integrated with the driving circuit member 6 that includes an active matrix thin-film transistor layer (not shown), so that a photodetection function included in the photodetection display apparatus is obtained.

The embodiment of the photodetection device 2 further includes a substrate 90, on which the photodiode unit 30 and the thin film transistor unit 20 are formed. The substrate 90 may be a glass sheet or a flexible sheet. Referring to FIG. 2, the photodiode unit 30 includes a first embodiment of a photodetection film 3, a gate electrode layer 21', a first isolating layer 22', a source-and-drain electrode layer 25', a second isolating layer 26', and a metal-oxide transparent layer 27. The thin film transistor unit 20 is used for transmitting an electrical signal from the photodetection film 3. The thin film transistor unit 20 includes a thin film transistor 202 that includes a gate electrode layer 21 extending from the gate electrode layer 21' of the photodiode unit 30, a first isolating layer 22 extending from the first isolating layer 22' of the photodiode unit 30, an intrinsic amorphous silicon channel layer 23, an $n^+$-doping amorphous silicon source/drain contact layer 24, a source-and-drain electrode layer 25 extending from the source-and-drain electrode layer 25' of the photodiode unit 30, and a second isolating layer 26 extending from the second isolating layer 26' of the photodiode unit 30. In actual application, the gate electrode layer 21, the first isolating layer 22, the a source-and-drain electrode layer 25 and the second isolating layer 26 of the thin film transistor unit 20 may be respectively formed together with the gate electrode layer 21', the first isolating layer 22', the source-and-drain electrode layer 25', and the second isolating layer 26' of the photodiode unit 30 in a single-layer manner.

Figure 3:
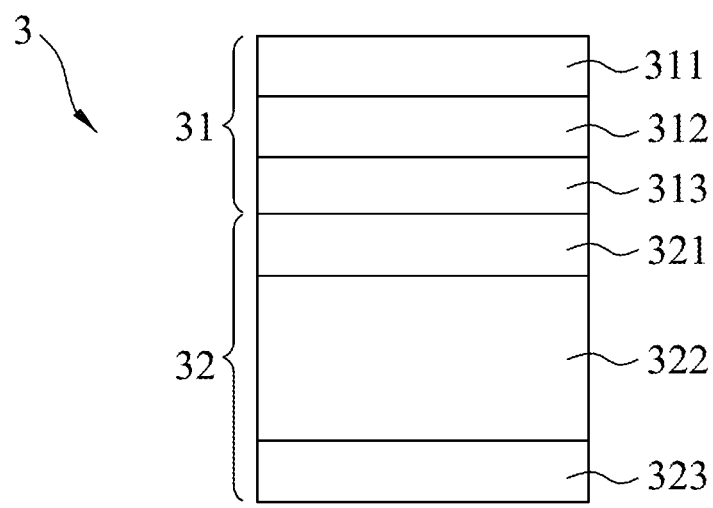
FIG. 3 is a schematic view illustrating a first embodiment of a photodetection film according to the disclosure.

Referring to FIG. 3, the photodetection film 3 includes at least one lower photodiode layered member 32, and at least one upper photodiode layered member 31 that is disposed on the at least one lower photodiode layered member 32. The at least one lower photodiode layered member 32 includes a lower first-type semiconductor layer 323, a lower intrinsic semiconductor layer 322 that is disposed on the lower first-type semiconductor layer 323, and a lower second-type semiconductor layer 321 that is disposed on the lower intrinsic semiconductor layer 322. The at least one upper photodiode layered member 31 is disposed on the at least one lower photodiode layered member 32, and includes an upper first-type semiconductor layer 313 that is disposed on the lower second-type semiconductor layer 321 of the at least one lower photodiode layered member 32, an upper intrinsic semiconductor layer 312 that is disposed on the upper first-type semiconductor layer 313, and an upper second-type semiconductor layer 311 that is disposed on the upper intrinsic semiconductor layer 312.

Each of the lower and upper second-type semiconductor layers 321, 311 is one of a p-type semiconductor layer and an n-type semiconductor layer, and each of the lower and upper first-type semiconductor layers 323, 313 is the other one of the p-type semiconductor layer and the n-type semiconductor layer. In this embodiment, the upper photodiode layered member 31 and the lower photodiode layered member 32 are stacked upon each other and electrically connected to each other in series. Hence, the photoelectric conversion efficiency (e.g., photoelectric conversion quantum efficiency) of the photodetection film 3 is improved, and the photodetection device 2 including the photodetection film 3 can be used in a high photosensitivity field, e.g., a photodetection display apparatus. In this embodiment, the upper and lower second-type semiconductor layers are p-type semiconductor layers, and the upper and lower first-type semiconductor layers are n-type semiconductor layers.

The photodetection film 3 may further include more than one of the upper photodiode layered members 31. In one form, the photodetection film 3 may include two of the upper photodiode layered members 31 that are sequentially disposed on the lower photodiode layered member 32, such that the lower and upper photodiode layered members 32, 31 are electrically connected in series. That is to say, one of the two upper photodiode layered members 31 is disposed on the lower photodiode layered member 32, and the other one of the two photodiode layered members 31 is disposed on the one of the two photodiode layered members 31. Similarly, the photodetection film 3 may include more than one of the lower photodiode layered members 32, and the lower photodiode layered members 32 and the upper photodiode layered members 31 are stacked upon and electrically connected to one another in series.

In one form, when the upper intrinsic semiconductor layer 312 of the upper photodiode layered member 31 has an amorphous silicon structure and the lower intrinsic semiconductor layer 322 of the lower photodiode layered member 32 has a structure selected from a microcrystalline silicon structure, a microcrystalline silicon-germanium structure, and a non-crystalline silicon-germanium structure, the photodetection film 3 can convert light absorbed thereby to an electrical signal, and a wavelength range of the absorbed light can be expanded from visible light to near infrared light or infrared light. More specifically, the upper intrinsic semiconductor layer 312 is arranged for receiving the light having the wavelength range within the visible light, and the lower intrinsic semiconductor layer 322 is arranged for receiving the light having the wavelength ranging from the visible light to the infrared light or near infrared light.

In one form, the amorphous silicon structure of the upper intrinsic semiconductor layer 312 has a crystallinity less than 40% and a band gap ranging from 1.7 eV to 1.8 eV. The amorphous silicon structure is made from silane and hydrogen gas using chemical vapor deposition (CVD) techniques.

In one form, the lower intrinsic semiconductor layer 322 has the microcrystalline silicon structure with a crystallinity greater than 40% and a band gap less than 1.7 eV. The microcrystalline silicon structure is made from silane and hydrogen gas using CVD techniques. The band gap in electronic volts (eV) is also known as a band width, and refers to an energy difference in a band structure between a valence band and a conduction band. When electrons within a semiconducting material have energy greater than the band gap, the electrons will bound from the valence band to the conduction band gap so as to become free electrons, and thus the semiconducting material will be electrically conductive. The band gap is an important property of the semiconducting material and is determined by a crystal structure and binding properties of atoms, etc.

In one form, the lower intrinsic semiconductor layer 322 has one of the non-crystalline silicon-germanium structure and the microcrystalline silicon-germanium structure, and all of which have a band gap less than 1.7 eV. Each of the non-crystalline silicon-germanium structure and the microcrystalline silicon-germanium structure is made from silane, germane and hydrogen gas using CVD techniques. At room temperature (300K), the band gap of the germanium is 0.66 eV, and the band gap of the lower intrinsic semiconductor layer 322 decreased when germanium is doped in saline. Since the band gap of the lower intrinsic semiconductor layer 322 is less than 1.7 eV, the lower intrinsic semiconductor layer 322 can absorb the light having the wavelength ranging from the visible light to the infrared light (or near infrared light). By controlling the concentration of germane, the lower photodiode layered member 32 having one of the non-crystalline silicon-germanium structure and the microcrystalline silicon-germanium structure can absorb the light having an expanded wavelength ranging from 600 nm to 1000 nm.

Figure 4:
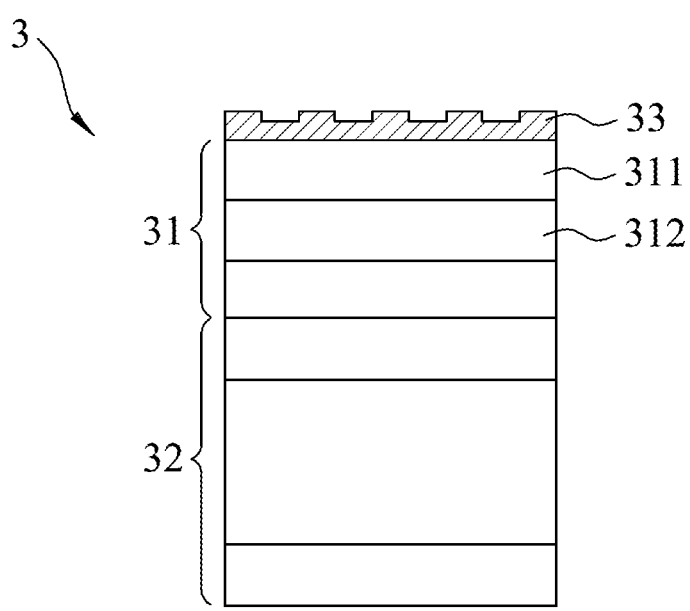
FIG. 4 is a schematic view illustrating a second embodiment of the photodetection film according to the disclosure.

Referring to FIG. 4, a second embodiment of the photodetection film 3 according to the disclosure further includes an upper optical film 33 that is immediately disposed on the upper second-type semiconductor layer 311 of the upper photodiode layered member 31. The upper optical film 33 is used for reducing a reflection rate of light from a top surface of the upper second-type semiconductor layer 311 or a refraction angle of light in the upper second-type semiconductor layer 311. Since the refraction angle of light in the upper second-type semiconductor layer 311 is reduced, the light passing through the upper second-type semiconductor layer 311 is close to a normal line of the upper second-type semiconductor layer 311 that is perpendicular to a surface. Hence, a light flux passing through the upper second-type semiconductor layer 311 to the upper intrinsic semiconductor layer 312 is increased, and the photoelectric conversion efficiency of the upper photodiode layered member 31 is thus improved.

In one form, the upper optical film 33 has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically. The upper optical film 33 has a refractive index smaller than that of the upper second-type semiconductor layer 311.

Figure 5:
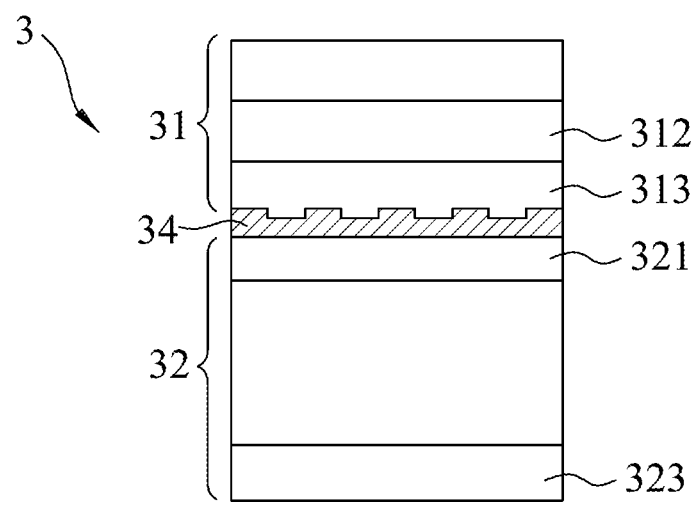
FIG. 5 is a schematic view illustrating a third embodiment of the photodetection film according to the disclosure.

Referring to FIG. 5, a third embodiment of the photodetection film 3 according to the disclosure further includes an intermediate optical film 34 that is disposed between the lower second-type semiconductor layer 321 of the lower photodiode layered member 32 and the upper first-type semiconductor layer 313 of the upper photodiode layered member 31. The intermediate optical member 34 is used for reflection of light from the upper first-type semiconductor layer 313 to the upper intrinsic semiconductor layer 312 when the light passes through the upper first-type semiconductor layer 313, so that the light reflected by the intermediate optical film 34 is absorbed again by the upper intrinsic semiconductor layer 312 of the upper photodiode layered film 31.

In one form, the intermediate optical film 34 has a structure selected from a photonic crystal structure with a refractive index varied periodically, an incident light-scattered crystal structure with a refractive index varied non-periodically, and an incident light-diffused crystal structure with a refractive index varied non-periodically. Therefore, the wavelength range of the light that is able to be absorbed by the upper intrinsic semiconductor layer 312 is enlarged appropriately, and thus a photoelectric current produced in the upper intrinsic semiconductor layer 312 is increased.

Figure 6:
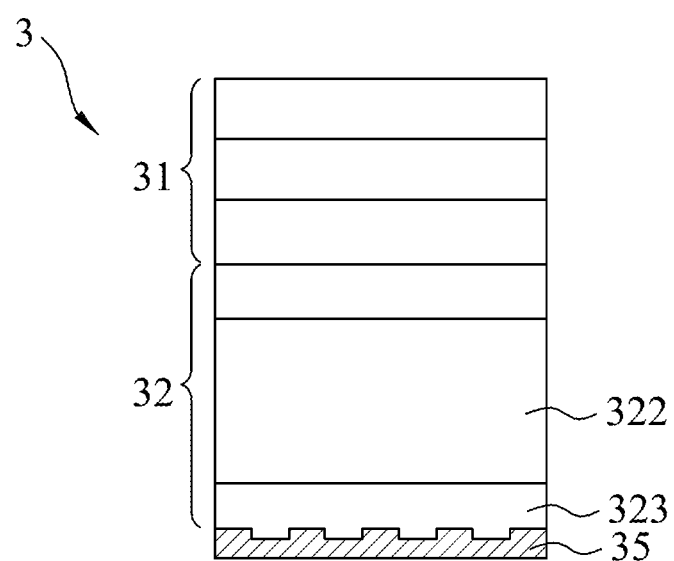
FIG. 6 is a schematic view illustrating a fourth embodiment of the photodetection film according to the disclosure.

Referring to FIG. 6, a fourth embodiment of the photodetection film 3 according to the disclosure further includes a lower optical film 35 that is disposed beneath the lower first-type semiconductor layer 323 of the lower photodiode layered member 32. The lower optical film 35 is used for reflection of light from the lower first-type semiconductor layer 323 to the lower intrinsic semiconductor layer 322 when the light passes through the lower first-type semiconductor layer 323, so that the light reflected by the lower optical member 35 is absorbed again by the lower intrinsic semiconductor layer 322 of the lower photodiode layered film 32.

In one form, the lower optical film 35 has a structure selected from a photonic crystal structure with a refractive index varied periodically, an incident light-scattered crystal structure with a refractive index varied non-periodically, and an incident light-diffused crystal structure with a refractive index varied non-periodically. Therefore, the wavelength range of the light that is able to be absorbed by the lower intrinsic semiconductor layer 322 is enlarged appropriately, and thus the photoelectric current produced in the lower intrinsic semiconductor layer 322 is increased.

Figure 7:
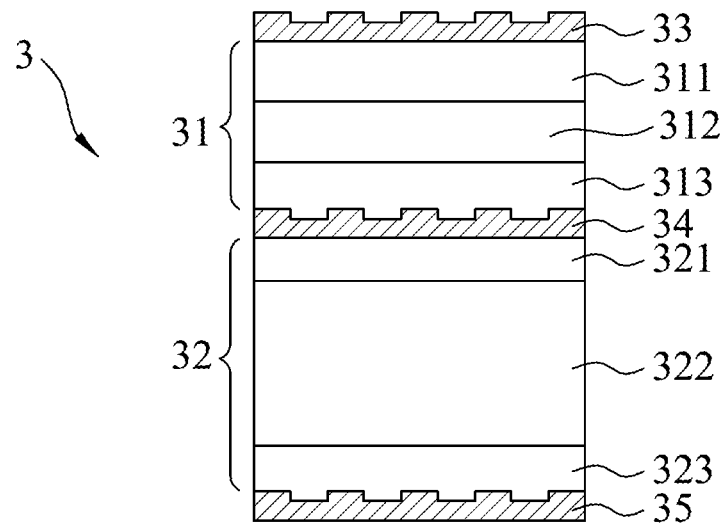
FIG. 7 is a schematic view illustrating a fifth embodiment of the photodetection film according to the disclosure.

Referring to FIG. 7, a fifth embodiment of the photodetection film 3 according to the disclosure further includes the lower optical film 35, the intermediate optical film 34 and the upper optical film 33. The upper, intermediate and lower optical films 33, 34, 35 have been mentioned in the above description. With the inclusion of the upper and intermediate optical films 33, 34, a multiple-reflection of the light can occur in the upper intrinsic semiconductor layer 312. Therefore, the absorption of the light in the upper intrinsic semiconductor layer 312 is increased, and thus the photoelectric conversion efficiency of the upper intrinsic semiconductor layer 312 is improved. The multiple-reflection of the light in the upper intrinsic semiconductor layer 312 refers to a light reflected by the intermediate optical film 34 and the upper optical film 33 more than once before the light is absorbed in the upper intrinsic semiconductor layer 312. Similarly, with the inclusion of the lower and intermediate optical films 35, 34, a multiple-reflection of the light can occur in the lower intrinsic semiconductor layer 322. Therefore, the absorption of the light in the lower intrinsic semiconductor layer 322 is increased, and thus the photoelectric conversion efficiency of the lower intrinsic semiconductor layer 322 is improved.

Figure 8:
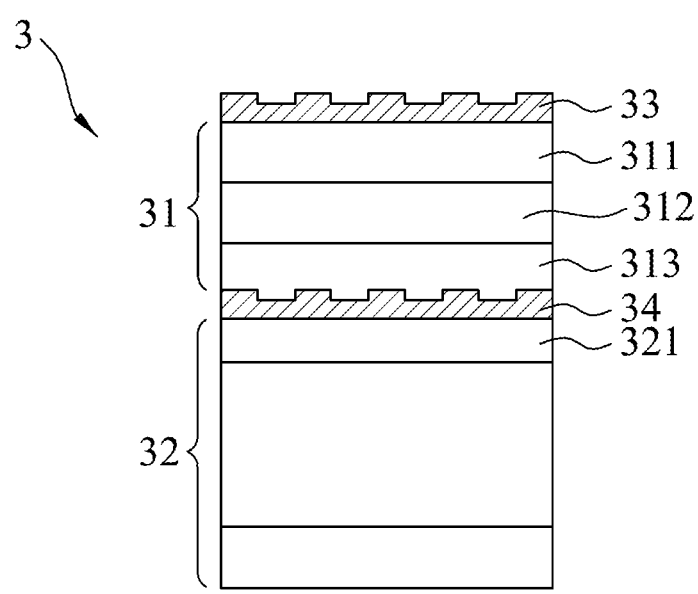
FIG. 8 is a schematic view illustrating a sixth embodiment of the photodetection film according to the disclosure.

Referring to FIG. 8, a sixth embodiment of the photodetection film 3 according to the disclosure further includes the upper optical film 33 and the intermediate optical film 34, and is free of the lower optical film 35.

Figure 9:
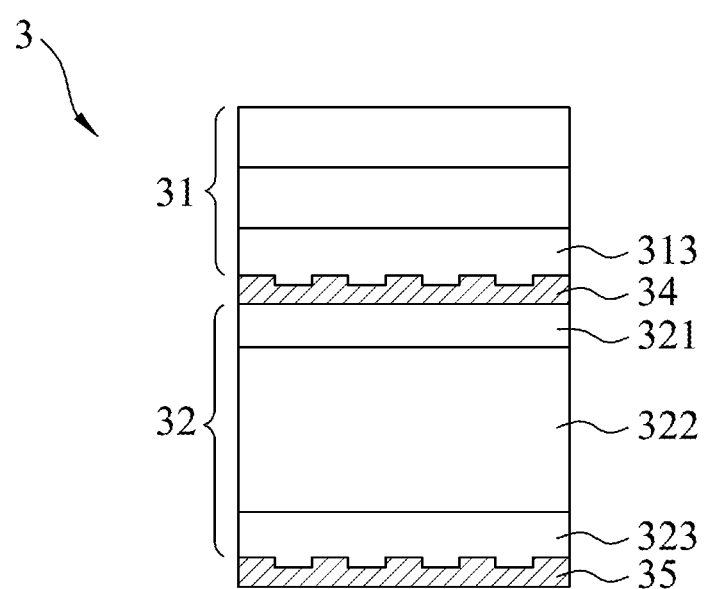
FIG. 9 is a schematic view illustrating a seventh embodiment of the photodetection film according to the disclosure.

Referring to FIG. 9, a seventh embodiment of the photodetection film 3 according to the disclosure further includes the lower optical film 35 and the intermediate optical film 34, and is free of the upper optical film 33.

In one form, each of the upper, intermediate and lower optical films 33, 34, 35 is made from an oxygen-containing compound selected from a group consisting of silicon oxide having a formula of $SiO_x$, x is not less than 1, niobium pentaoxide ($Nb_2O_5$), zinc oxide (ZnO), indium tin oxide (ITO), titanium dioxide ($TiO_2$), aluminum-doped zinc oxide (AZO), indium gallium zinc oxide (IGZO), tin dioxide ($SnO_2$), fluorine-doped tin oxide (FTC) and combinations thereof. In another form, each of the upper, intermediate and lower optical films 33, 34, 35 is made from a nitrogen-containing compound having a formula of $SiN_y$, y is not less than 1.

Referring to FIG. 10, a first embodiment of a photodetection display apparatus according to the disclosure includes a display unit 5 defining at least one photodetection region 50, a glass covering plate 4 disposed on the display unit 5 for protecting the display unit 5, a driving circuit member 6 electrically connected to the display unit 5, and at least one photodetection assembly 7 disposed below the at least one photodetection region 50. The photodetection assembly 7 includes the abovementioned photodetection device 2.

The photodetection display apparatus serves as an image detection apparatus without a lens, and may detect a fingerprint, a face, an eyeball, or a user's posture, etc. The photodetection display apparatus may be an electronic apparatus including a touch display screen, such as a portable apparatus (e.g., a cell phone, a tablet, a personal digital assistant (PDA), etc.), a personal computer, or an industrial computer. The photodetection display apparatus may be incorporated with an optical imaging device (not shown) that is disposed between the display unit 5 and an eye of the user in practice. When a projection of the eye of the user is imaged on the optical imaging device, the projection is projected within an eye gaze tracking area (not shown) that is defined in the display unit 5 and then is captured by a transmitting and sensing unit (not shown) disposed below the eye gaze tracking area. By virtue of the cooperation of the photodetection device 2 and the display unit 5, the photodetection display apparatus can be used in a virtual reality (VR) field.

The display member 51 of the display unit 5 includes a thin film transistor for driving the display member 51 and transmitting electrical signals. The display member 51 is selected from one of an active organic light emitting diode (OLED) photodetection display device, a liquid crystal display (LCD) display device, a quantum doc photodetection display device, and an electronic ink (E-ink) photodetection display device.

Figure 11:
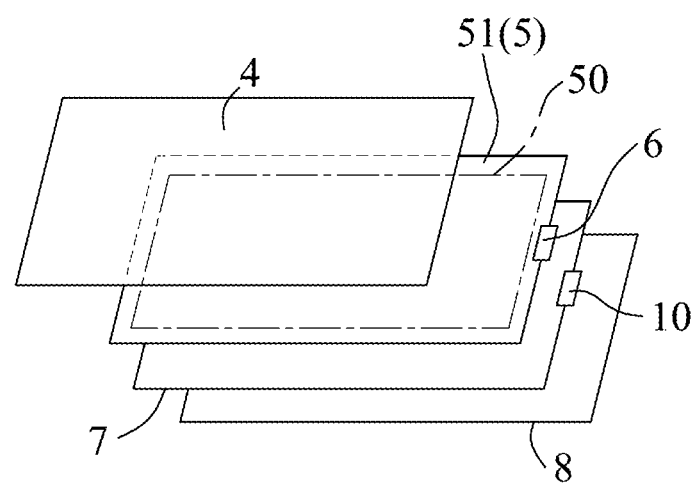
FIG. 11 is a schematic view illustrating another embodiment of the photodetection display apparatus according to the disclosure.

Referring to FIG. 11, when the display member is the LCD photodetection display apparatus, the photodetection display apparatus further includes a backlight unit 8 that is mounted to the photodetection assembly 7 such that the photodetection device 2 is disposed between the display unit 5 and the backlight unit 8. The backlight unit 8 is used for emitting light. The backlight unit 8 may be a light emitting diode (LED) backlight module, or other electronic device that can emit light.

In one form, when the display member 51 is the OLED photodetection display apparatus that is self-luminous, the photodetection display apparatus is free of the backlight unit 8.

The photodetection device 2 may be integrated with the thin film transistor layer (not shown) of the display member 51, or may be spaced apart from the display unit 5 (as shown in FIG. 10).

In one form, the display unit 5 may define a plurality of the photodetection regions 50. The photodetection display apparatus includes a plurality of the photodetection assemblies 7, each of which corresponds in position to a respective one of the photodetection regions 50.

In the embodiment, the photodetection assembly 7 of the photodetection display apparatus further includes a drive and control circuit unit 10. The drive and control circuit unit 10 is electrically connected to the thin film transistor unit 30 of the photodetection device 2 to drive the photodetection assembly 7.

When a number of the photodetection regions 50 of the display unit 5 is exemplified to be two and the number of the photodetection assemblies 7 is exemplified to be two, the photodetection regions 50 may be respectively at a top portion and a bottom portion of the display unit 5, or may be respectively at a right portion and a left portion of the display unit 5. More specifically, each of the photodetection assemblies 7 is disposed beneath a respective one of the photodetection regions 50. The photodetection devices 2 of the photodetection assemblies 7 are turned on by the turn-on and turn-off signals that are controlled by the user. In one form, the photodetection regions 50 cooperatively cover the entire area of the display unit 5, so that all of the light passing through the photodetection regions 50 of the display unit 5 can be absorbed by the photodetection devices 2. In one form, the photodetection regions 50 may cover two-thirds or three-fourths of the area of the display unit 5. The photodetection assemblies 7 may be controlled in such a manner that one of the photodetection devices 2 is controlled to be turned on and the other one of the photodetection devices 2 is controlled to be turned off.

In one form, the number of the photodetection regions 50 may be determined based on the actual use, and the turn-on or turn-off state of each of the photodetection devices 2 may be controlled by the user.

Figure 12:
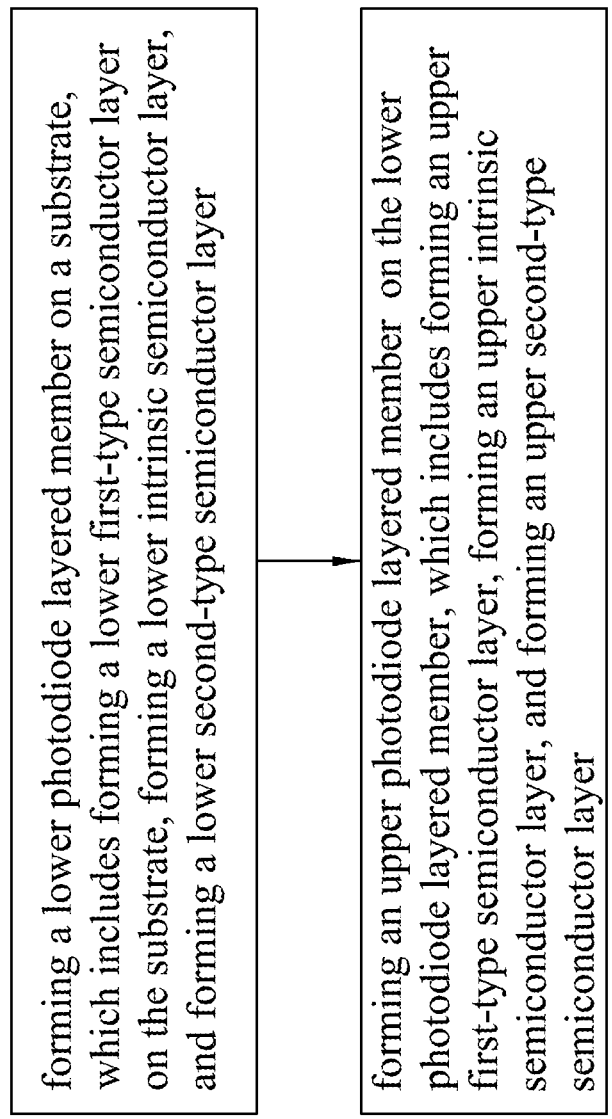
FIG. 12 is a flow chart of the first embodiment of the photodetection film.

Referring to FIG. 12, an embodiment of a method of making a photodetection device 2 having relatively great photoelectric conversion efficiency is illustrated. The method includes: forming the lower photodiode layered member 32 on the substrate 90, which includes forming the lower first-type semiconductor layer 323 on the substrate 90, forming the lower intrinsic semiconductor layer 322 on the lower first-type semiconductor layer 323, and forming the lower second-type semiconductor layer 321 on the lower intrinsic semiconductor layer 322; and forming the upper photodiode layered member 31 on the lower photodiode layered member 32, which includes forming the upper first-type semiconductor layer 313 on the lower second-type semiconductor layer 321, forming the upper intrinsic semiconductor layer 312 on the upper first-type semiconductor layer 313, and forming an upper second-type semiconductor layer 311 on the upper intrinsic semiconductor layer 312. The upper intrinsic semiconductor layer 312 has an amorphous silicon structure. The lower intrinsic semiconductor layer 322 has a structure selected from a microcrystalline silicon structure, a microcrystalline silicon-germanium structure, and a non-crystalline silicon-germanium structure.

The substrate 90 may be a glass sheet or a flexible sheet. More specifically, the substrate 90 may be the flexible sheet, and thus the photodetection display apparatus may be thin in thickness and light in weight. Hence, the user's experience can be improved.

In one form, the lower intrinsic semiconductor layer 322 may have the microcrystalline silicon structure and is formed from silane and hydrogen gas using CVD techniques. The microcrystalline silicon structure has crystallinity greater than 40% and the band gap less than 1.7 eV.

In one form, the lower intrinsic semiconductor layer 322 may have one of the non-crystalline silicon germanium structure and the microcrystalline silicon germanium structure, and is formed from silane, hydrogen gas and germane using the CVD techniques. The band gap of the lower intrinsic semiconductor layer 322 is less than 1.7 eV.

In one form, the method of the disclosure may further include a step of forming the upper optical film 33 on the upper second-type semiconductor layer 311 of the upper photodiode layered member 31. The upper optical film 33 is used for reducing the reflection rate of light from the top surface of the upper second-type semiconductor layer 311 or the refraction angle of light in the upper second-type semiconductor layer 311.

In one form, the method may further include a step of forming the intermediate optical film 34 between the upper first-type semiconductor layer 313 of the upper photodiode layered member 31 and the lower second-type semiconductor layer 321 of the lower photodiode layered member 32. The intermediate optical film 34 has a refractive index smaller than that of the upper first-type semiconductor layer 313. The intermediate optical film 34 is used for reflecting the light passing through the upper first-type semiconductor layer 313, and thus the light can be absorbed by the upper intrinsic semiconductor layer 312.

In one form, the method may further include a step of forming the lower optical film 35 beneath the lower first-type semiconductor layer 323 of the lower photodiode layered member 32. The lower optical film 35 has a refractive index smaller than that of the lower first-type semiconductor layer 323. The lower optical film 35 is used for reflecting the light passing through the lower first-type semiconductor layer 323, and thus the light can be absorbed by the lower intrinsic semiconductor layer 322.

In one form, the method may further include steps of forming the upper optical film 33 on the upper second-type semiconductor layer 311 of the upper photodiode layered member 31, forming the intermediate optical film 34 between the upper first-type semiconductor layer 313 of the upper photodiode layered member 31 and the lower second-type semiconductor layer 321 of the lower photodiode layered member 32, and forming the lower optical film 35 beneath the lower first-type semiconductor layer 323 of the lower photodiode layered member 32.

In one form, the upper photodiode layered member 31 may have one or more the upper second-type semiconductor layers 311 and the lower photodiode layered member 32 may have one or more the lower second-type semiconductor layers 321. In the case of inclusion of more of the upper second-type semiconductor layers 311 or more of the lower second-type semiconductor layers 321, the upper and lower second-type semiconductor layers 311, 321 may be designed to have different compositions. The upper and lower second-type semiconductor layers 311, 321 may be formed from silane, hydrogen gas and trimethylborane ($[B(CH_3)_3]$) using the CVD techniques, or may be formed from silane, hydrogen gas and borane using the CVD techniques. Similarly, the upper photodiode layered member 31 may have one or more the upper first-type semiconductor layers 313 and the lower photodiode layered member 32 may have one or more the lower first-type semiconductor layers 323. In the case of inclusion of more of the lower first-type semiconductor layers 323 or more of the upper first-type semiconductor layers 313, the lower and upper first-type semiconductor layers 323, 313 may be designed to have different compositions.

To sum up, by virtue of the design of the at least one of the photodiode layered members 31, 32 that are stacked upon and electrically connected to each other in series, and the particular structures of the upper and lower intrinsic semiconductor layers 312, 322, the photodetection wavelength range of the photodetection film 3 of the disclosure can be expanded to be from the visible light to the infrared light or near the infrared light, thus improving the photoelectric conversion efficiency.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A photodetection film, comprising:
   at least one lower photodiode layered member including a lower first-type semiconductor layer, a lower intrinsic semiconductor layer that is disposed on said lower first-type semiconductor layer, and a lower second-type semiconductor layer that is disposed on said lower intrinsic semiconductor layer; and
   at least one upper photodiode layered member disposed on said at least one lower photodiode layered member, and including an upper first-type semiconductor layer that is disposed on said lower second-type semiconductor layer of said at least one lower photodiode layered member, an upper intrinsic semiconductor layer that is disposed on said upper first-type semiconductor layer, and an upper second-type semiconductor layer that is disposed on said upper intrinsic semiconductor layer,
   wherein each of said lower and upper second-type semiconductor layers is one of a p-type semiconductor layer and an n-type semiconductor layer, each of said lower and upper first-type semiconductor layers being the other one of the p-type semiconductor layer and the n-type semiconductor layer;
   wherein said upper intrinsic semiconductor layer has an amorphous silicon structure, said lower intrinsic semiconductor layer having a structure selected from one of a microcrystalline silicon structure, a microcrystalline silicon-germanium structure, and a non-crystalline silicon-germanium structure; and
   wherein said photodetection film further includes an upper optical film that is immediately disposed on said upper second-type semiconductor layer of said upper photodiode layered member for reducing an amount of reflection of light from a top surface of said upper second-type semiconductor layer or a refraction angle of light in said upper second-type semiconductor layer, said upper optical film having a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, said upper optical film having a refractive index smaller than that of said upper second-type semiconductor layer.

2. The photodetection film of claim 1, wherein the amorphous silicon structure of said upper intrinsic semiconductor layer has a crystallinity less than 40% and a band gap ranging from 1.7 eV to 1.8 eV.

3. The photodetection film of claim 1, wherein said lower intrinsic semiconductor layer has the microcrystalline silicon structure with a crystallinity greater than 40% and a band gap less than 1.7 eV.

4. The photodetection film of claim 1, wherein said lower intrinsic semiconductor layer has one of the non-crystalline silicon-germanium structure and the microcrystalline silicon-germanium structure, all of which have a band gap less than 1.7 eV.

5. The photodetection film of claim 1, further comprising an intermediate optical film that is disposed between said upper first-type semiconductor layer of said upper photodiode layered member and said lower second-type semiconductor layer of said lower photodiode layered member for reflection of light from said upper first-type semiconductor layer to said upper intrinsic semiconductor layer when the light passes through said upper first-type semiconductor layer.

6. The photodetection film of claim 1, further comprising a lower optical film that is disposed beneath said lower first-type semiconductor layer of said lower photodiode layered member for reflection of light from said lower first-type semiconductor layer to said lower intrinsic semiconductor layer when the light passes through said lower first-type semiconductor layer.

7. The photodetection film of claim 5, further comprising a lower optical film that is disposed beneath said lower first-type semiconductor layer of said lower photodiode layered member, wherein each of said intermediate and lower optical films has a structure selected from a photonic crystal structure with a refractive index varied periodically, an incident light-scattered crystal structure with a refractive index varied non-periodically, and an incident light-diffused crystal structure with a refractive index varied non-periodically.

8. The photodetection film of claim 7, wherein each of said upper, intermediate and lower optical films is made from a nitrogen-containing compound having a formula of SiNy, y being not less than 1.

9. A photodetection device, comprising:
a photodiode unit including a photodetection film as claimed in claim 1; and
a thin film transistor unit including a thin film transistor that is electrically connected to said photodetection film of said photodiode unit for transmitting electrical signal from said photodetection film.

10. A photodetection display apparatus, comprising:
a display unit defining at least one photodetection region; and
at least one photodetection assembly disposed below said at least one photodetection region, said at least one photodetection assembly including a photodetection device as claimed in claim 9.

11. The photodetection display apparatus of claim 10, wherein said display unit including a display member, and a driving circuit member that is electrically connected to said display member so as to drive said display member, said display member being selected from one of an active organic light emitting diode (OLED) display device, a liquid crystal display (LCD) device, a micro light emitting diode (LED), a quantum dot display device, and an electronic ink (E-ink) display device.

12. The photodetection display apparatus of claim 11, wherein said display member is the LCD device, said photodetection display apparatus further comprising a backlight unit that is mounted to the photodetection device such that said photodetection device is disposed between said display unit and said backlight unit.

13. The photodetection display apparatus of claim 10, wherein said display unit defines a plurality of said photodetection regions, said photodetection display apparatus including a plurality of said photodetection assemblies, each of which corresponds in position to a respective one of said photodetection regions.

14. The photodetection display apparatus of claim 10, wherein said photodetection assembly further includes a drive and control circuit unit electrically connected to said thin film transistor unit of said photodetection device so as to turn-on and turn-off said thin film transistor unit upon receiving turn-on and turn-off signals, respectively.

15. A photodetection film comprising:
at least one lower photodiode layered member including a lower first-type semiconductor layer, a lower intrinsic semiconductor layer that is disposed on said lower first-type semiconductor layer, and a lower second-type semiconductor layer that is disposed on said lower intrinsic semiconductor layer; and
at least one upper photodiode layered member disposed on said at least one lower photodiode layered member, and including an upper first-type semiconductor layer that is disposed on said lower second-type semiconductor layer of said at least one lower photodiode layered member, an upper intrinsic semiconductor layer that is disposed on said upper first-type semiconductor layer, and an upper second-type semiconductor layer that is disposed on said upper intrinsic semiconductor layer,
wherein each of said lower and upper second-type semiconductor layers is one of a p-type semiconductor layer and an n-type semiconductor layer, each of said lower and upper first-type semiconductor layers being the other one of the p-type semiconductor layer and the n-type semiconductor layer;

wherein said upper intrinsic semiconductor layer has an amorphous silicon structure, said lower intrinsic semiconductor layer having a structure selected from one of a microcrystalline silicon structure, a microcrystalline silicon-germanium structure, and a non-crystalline silicon-germanium structure; and
wherein said photodetection film further includes an upper optical film that is immediately disposed on said upper second-type semiconductor layer of said upper photodiode layered member for reducing an amount of reflection of light from a top surface of said upper second-type semiconductor layer or a refraction angle of light in said upper second-type semiconductor layer, said upper optical film being made from an oxygen-containing compound selected from a group consisting of silicon oxide having a formula of SiOx, x being not less than 1, niobium pentaoxide ($Nb_2O_5$), zinc oxide (ZnO), indium tin oxide (ITO), titanium dioxide ($TiO_2$), aluminum-doped zinc oxide (AZO), indium gallium zinc oxide (IGZO), tin dioxide ($SnO_2$), fluorine-doped tin oxide (FTO) and combinations thereof.

16. A method of making a photodetection film comprising:
forming a lower photodiode layered member on a substrate, which includes forming a lower first-type semiconductor layer on the substrate, forming a lower intrinsic semiconductor layer on the lower first-type semiconductor layer, and forming a lower second-type semiconductor layer on the lower intrinsic semiconductor layer;
forming an upper photodiode layered member on the lower photodiode layered member, which includes forming an upper first-type semiconductor layer on the lower second-type semiconductor layer of the lower photodiode layered member, forming an upper intrinsic semiconductor layer on the upper first-type semiconductor layer, and forming an upper second-type semiconductor layer on the upper intrinsic semiconductor layer; and
forming an upper optical film on the upper second-type semiconductor layer of the upper photodiode layered member for reducing an amount of reflection of light from a top surface of the upper second-type semiconductor layer or a refraction angle of light in the upper second-type semiconductor layer,
wherein each of the lower and upper second-type semiconductor layers is formed into one of a p-type semiconductor layer and an n-type semiconductor layer, each of the lower and upper first-type semiconductor layers being formed into the other one of the p-type semiconductor layer and the n-type semiconductor layer;
wherein the upper intrinsic semiconductor layer has an amorphous silicon structure, the lower intrinsic semiconductor layer having a structure selected from a microcrystalline silicon structure, a microcrystalline silicon-germanium structure, and a non-crystalline silicon-germanium structure; and
wherein the upper optical film has a structure selected from one of a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, the upper optical film having a refractive index smaller than that of the upper second-type semiconductor layer.

17. The method of making a photodetection device of claim 16, wherein the amorphous silicon structure of the upper intrinsic semiconductor layer is formed from silane and hydrogen gas using chemical vapor deposition (CVD) techniques, and has a crystallinity less than 40%.

18. The method of making a photodetection device of claim 16, wherein the lower intrinsic semiconductor layer has the microcrystalline silicon structure and is formed from silane and hydrogen gas using CVD techniques, the microcrystalline silicon structure having a crystallinity greater than 40%.

19. The method of making a photodetection device of claim 16, wherein the lower intrinsic semiconductor layer has one of the non-crystalline silicon germanium structure and the microcrystalline silicon germanium structure, and is formed from silane, hydrogen gas and germane using CVD techniques.

20. The method of making a photodetection device of claim 19, wherein the upper optical film is made from a nitrogen-containing compound having a formula of SiNy, y being greater than 1, using one of CVD techniques and sputtering.

21. A method of making a photodetection film of claim 16, wherein the upper optical film is made from an oxygen-containing compound selected from a group consisting of silicon oxide having a formula of SiOx, x being not less than 1, niobium pentaoxide ($Nb_2O_5$), zinc oxide (ZnO), indium tin oxide (ITO), titanium dioxide ($TiO_2$), aluminum-doped zinc oxide (AZO), indium gallium zinc oxide (IGZO), tin dioxide ($SnO_2$), fluorine-doped tin oxide (FTO) and combinations thereof, using one of CVD techniques and sputtering.

22. The method of making a photodetection device of claim 16, further comprising forming an intermediate optical film between the upper first-type semiconductor layer of the upper photodiode layered member and the lower second-type semiconductor layer of the lower photodiode layered member, the intermediate optical film having a refractive index smaller than that of the upper first-type semiconductor layer.

23. The method of making a photodetection device of claim 22, wherein the intermediate optical film has a structure selected from one of a photonic crystal structure with a refractive index varied periodically, an incident light-scattered crystal structure with a refractive index varied non-periodically, and an incident light-diffused crystal structure with a refractive index varied non-periodically.

24. The method of making a photodetection device of claim 22, wherein the intermediate optical film is made from an oxygen-containing compound selected from a group consisting of silicon oxide having a formula of SiOx, x being greater than 1, niobium pentaoxide ($Nb_2O_5$), zinc oxide (ZnO), indium tin oxide (ITO), titanium dioxide ($TiO_2$), aluminum-doped zinc oxide (AZO), indium gallium zinc oxide (IGZO), tin dioxide ($SnO_2$), fluorine-doped tin oxide (FTO) and combinations thereof, using one of CVD techniques and sputtering.

25. The method of making a photodetection device of claim 22, wherein the intermediate optical film is made from a nitrogen-containing compound having a formula of SiNy, y being greater than 1, using one of CVD techniques and sputtering.

26. The method of making a photodetection device of claim 16, further comprising forming a lower optical film beneath the lower first-type semiconductor layer of the lower photodiode layered member, the lower optical film having a refractive index smaller than that of the lower first-type semiconductor layer.

27. The method of making a photodetection device of claim 26, wherein the lower optical film has a structure selected from one of a photonic crystal structure with a refractive index varied periodically, an incident light-scattered crystal structure with a refractive index varied non-periodically, and an incident light-diffused crystal structure with a refractive index varied non-periodically.

28. The method of making a photodetection device of claim 26, wherein the lower optical film is made from an oxygen-containing compound selected from a group consisting of silicon oxide having a formula of SiOx, x being greater than 1, niobium pentaoxide ($Nb_2O_5$), zinc oxide (ZnO), indium tin oxide (ITO), titanium dioxide ($TiO_2$), aluminum-doped zinc oxide (AZO), indium gallium zinc oxide (IGZO), tin dioxide ($SnO_2$), fluorine-doped tin oxide (FTO) and combinations thereof, using one of CVD techniques and sputtering.

29. The method of making a photodetection device of claim 26, wherein the lower optical film is made from a nitrogen-containing compound having a formula of SiNy, y being greater than 1, using one of CVD techniques and sputtering.

* * * * *